United States Patent
Griswold et al.

(10) Patent No.: US 9,086,466 B2
(45) Date of Patent: Jul. 21, 2015

(54) ORDERING PROJECTIONS FOR MAGNETIC RESONANCE

(76) Inventors: Mark Griswold, Shaker Hts., OH (US);
Gregory R. Lee, Cincinnati, OH (US)

(*) Notice: Subject to any disclaimer, the term of this patent is extended or adjusted under 35 U.S.C. 154(b) by 545 days.

(21) Appl. No.: 13/446,361

(22) Filed: Apr. 13, 2012

(65) Prior Publication Data

US 2013/0271140 A1    Oct. 17, 2013

(51) Int. Cl.
*G01R 33/48*    (2006.01)
*G01R 33/563*    (2006.01)

(52) U.S. Cl.
CPC .......... *G01R 33/4826* (2013.01); *G01R 33/563* (2013.01)

(58) Field of Classification Search
None
See application file for complete search history.

(56) References Cited

U.S. PATENT DOCUMENTS 6,411,089 B1 *   6/2002   Anand et al. ................. 324/309
2007/0208234 A1 *   9/2007   Bhandarkar et al. .......... 600/300

OTHER PUBLICATIONS

Winkelmann et al., An Optimal Radial Profile Order Based on the Golden Ratio for Time-Resolved MRI, Jan. 2007, IEEE Transactions on Medical Imaging, vol. 26, No. 1.*
Welch et al., Speherical Navigator Echoes for Full 3D Rigid Body Motion Measurement in MRI, 2002, Magnetic Resonance in Medicine, vol. 47, pp. 32-41.*

* cited by examiner

*Primary Examiner* — Melissa Koval
*Assistant Examiner* — Maxwell A Tibbits (57) ABSTRACT

Example apparatus and methods order projections in a 3D MRI acquisition to achieve improved equidistant spacing or to achieve improved adherence to a target distribution. The equidistant or target spacing may exist in k-space and/or in kt-space. In one embodiment, the improved equidistant spacing is a substantially uniform spacing. The substantially uniform spacing may be achieved using a modification of a charge repulsion analysis that treats points of projections that intersect the surface of a 3D volume to be imaged as point charges distributed on the 3D volume. In another embodiment, the target spacing may be uniform, non-uniform, uniform in parts and non-uniform in other parts, and other combinations.

10 Claims, 11 Drawing Sheets

ORDERING PROJECTIONS FOR MAGNETIC RESONANCE

FEDERAL FUNDING NOTICE

The invention was developed with federal funding supplied under Federal Grant Number 1RO1 HL094557 by the National Institute of Health. The Federal government has certain rights in the invention.

COPYRIGHT NOTICE

A portion of the disclosure of this patent document contains material that is subject to copyright protection. The copyright owner has no objection to the facsimile reproduction of the patent document or the patent disclosure as it appears in the Patent and Trademark Office patent file or records, but otherwise reserves all copyright rights whatsoever.

BACKGROUND

Magnetic Resonance Imaging (MRI) is a widespread medical imaging technology. Some MRI applications (e.g., time resolved magnetic resonance angiography, cardiac imaging, dynamic contrast enhanced tumor imaging) seek to acquire a series of magnetic resonance (MR) images as quickly as possible. Some of these dynamic imaging applications use radial projections in either two-dimensional (2D) or three-dimensional (3D) spaces to acquire k-space data. Radial projections pass through and acquire the center of k-space where more object energy is located. Using radial projections may speed up acquisition times enough to remove the need to do cardiac or respiratory gating and may also reduce and/or eliminate bolus timing considerations in contrast enhanced imaging. In some examples, radial 3D acquisitions facilitate under-sampling a data space while still producing acceptable image quality.

Conventional systems have attempted to evenly distribute subsets of the full number of projections over the k-space volume. These conventional attempts have recognized that the order in which 3D radial projections are acquired affects image quality. Thus, conventional approaches have attempted to evenly distribute 3D projections in the volume being imaged. One conventional approach to distributing 3D projections is the 3D golden means algorithm of Chan et al., MRM 2009; 61(2): p 354. The 3D golden means algorithm attempts to order projections with nearly equidistant spacing regardless of time scale. While the 3D golden means algorithm improves over a purely random approach for some projection types, it may be limited to acquiring only a single radial projection per repetition time (TR). While the 3D golden means algorithm is useful for single radial projections, it may not be useful for bent trajectories or for multi-echo trajectories. Additionally, other conventional approaches may also be unsuitable for bent and/or multi-echo trajectories.

Conventional approaches that plan multi-echo trajectories may produce trajectories that lead to bunching of signals. This bunching may lead to different image quality at different points in k-space. For example, some regions may be sampled adequately and/or experience an acceptable number and/or type of artifacts while other regions may not be sampled adequately and/or may experience an unacceptable number and/or type of artifacts.

BRIEF DESCRIPTION OF THE DRAWINGS

The accompanying drawings, which are incorporated in and constitute a part of the specification, illustrate various example systems, methods, and other example embodiments of various aspects of the invention. It will be appreciated that the illustrated element boundaries (e.g., boxes, groups of boxes, or other shapes) in the figures represent one example of the boundaries. One of ordinary skill in the art will appreciate that in some examples one element may be designed as multiple elements or that multiple elements may be designed as one element. In some examples, an element shown as an internal component of another element may be implemented as an external component and vice versa. Furthermore, elements may not be drawn to scale.

DETAILED DESCRIPTION

Example apparatus and methods order projections for magnetic resonance. In one embodiment, projections are ordered for dynamic 3D MRI. Example apparatus and methods may determine the order for projections to achieve improved sampling in k-space and/or in kt-space. Improved sampling may occur when projections and thus sample points are more evenly distributed in space and/or time. The more even distribution may "spread out" sampling points in space and/or in time to mitigate issues associated with bunching produced by conventional systems. The projections may be, for example, radial, bent, multi-echo, and other projections. In one embodiment, an iterative approach to determining projections is undertaken until a threshold uniformity of distribution is achieved. In one embodiment the threshold may be configured with respect to how close to a uniform distribution in time and/or space is desired. In one embodiment, uniformity may be sought for the overall collection of sample points associated with a set of projections. In another embodiment, uniformity may also be sought for subsets of sample points associated with subsets of projections.

In one embodiment, phase encoding locations for a 3D Cartesian acquisition can also be determined. Example apparatus and methods may also determine the order for projections associated with bent projection imaging and multi-echo projection imaging. Example apparatus and methods may also optimize the spacing of projections for anisotropic field-of-view imaging.

In one embodiment, example apparatus and methods order individual projections of a set of 3D radial acquisitions to produce a substantially equal distribution over k-space. The substantially equal distribution may be achieved at different time scales. Producing the substantially equal distribution facilitates increasing flexibility in dynamic imaging applications. In another embodiment, example apparatus and methods order individual projections of a set of 3D radial acquisitions to produce a target distribution. In different examples the target distribution may be uniform, non-uniform, uniform in some portions and non-uniform in other portions, and other combinations.

Figure 1:
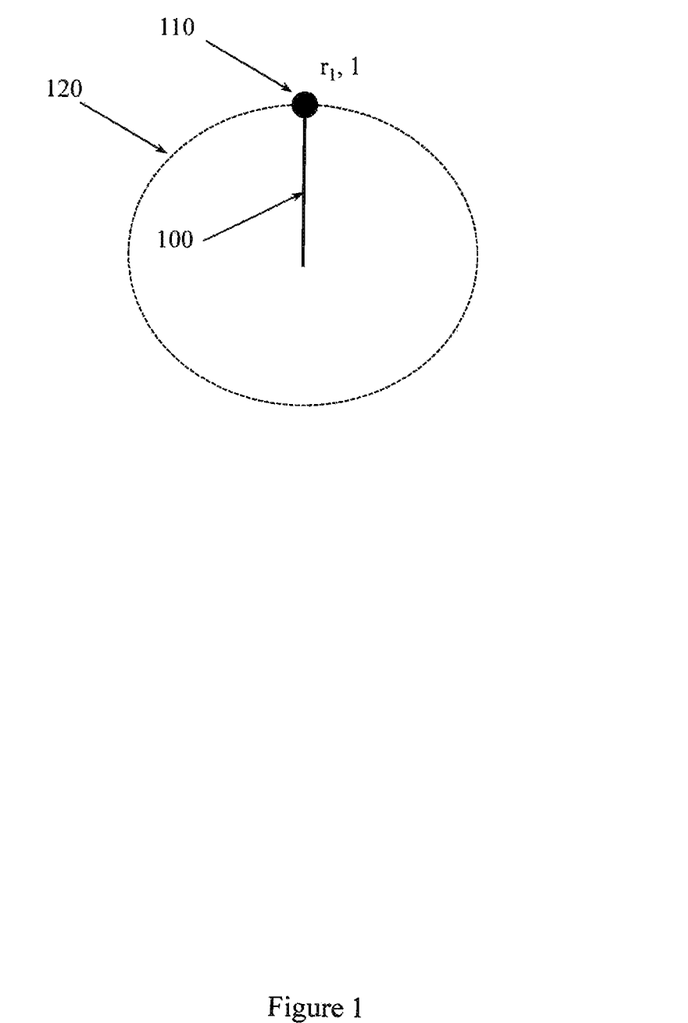
FIG. 1 illustrates a single linear projection acquired in a single TR.

Consider FIG. 1, which illustrates a single linear projection 100 acquired in a single TR. Conventional approaches like the 3D golden means algorithm may determine orderings that produce acceptable uniformity for distributions for this type of single linear projection. In this conventional approach, an orientation may be fully defined by a set of two angles. In FIG. 1, a point 110 at the end of radial projection 100 lies on the surface 120 of the area and/or volume of the object from which signal can be acquired using the radial projection. Radial projection 100 is a half projection that can be described by a radius r1 and an angle. Unlike conventional systems, example apparatus and methods may inform decisions concerning radial projection ordering by treating point 110, and other similar points associated with other radial projections, as though they are point charges on the surface of an object (e.g., sphere). More generally, example apparatus and methods inform decisions concerning radial projection ordering by determining the influence of other sample points associated with other radial projections on sample points in this radial projection. Even more generally, example apparatus and methods make decisions concerning projection ordering by determining the influence that other samples points associated with other projections have on sample points in this projection. The influence may be scaled based on distance between points, where the distance may be geographic or temporal.

Figure 2:
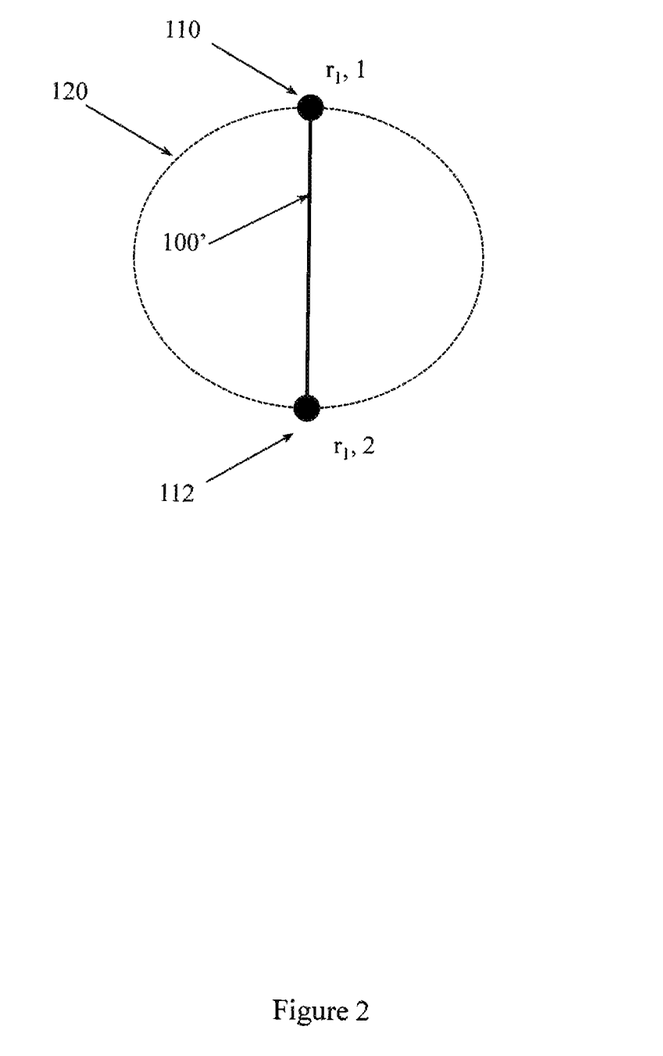
FIG. 2 illustrates a single linear projection acquired in a single TR.

FIG. 2 illustrates a full radial projection 100' that touches the surface 120 of the area and/or volume of the object at two points (110, 112). Full projection 100' can be described by the radius r1 and two angles. As described above, the golden means algorithm and other approaches may produce orderings that yield adequate distributions for half projections like projection 100 and full projections like projection 100'. However, conventional approaches may struggle with projections like those illustrated in FIGS. 3 and 4.

Figure 3:
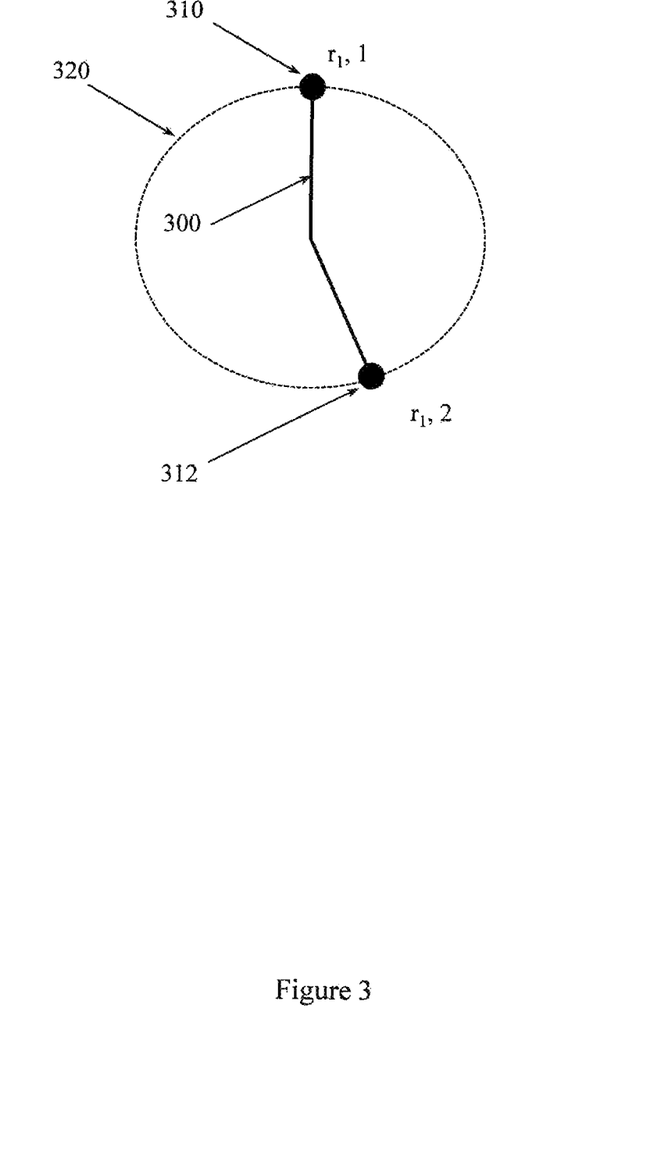
FIG. 3 illustrates a single bent projection acquired in a single TR.

FIG. 3 illustrates a bent projection 300 that touches the surface 320 of an object at points 310 and 312. Describing bent projection 300 requires more information (e.g., an additional rotation angle) than describing full projection 100' (FIG. 2).

Figure 4:
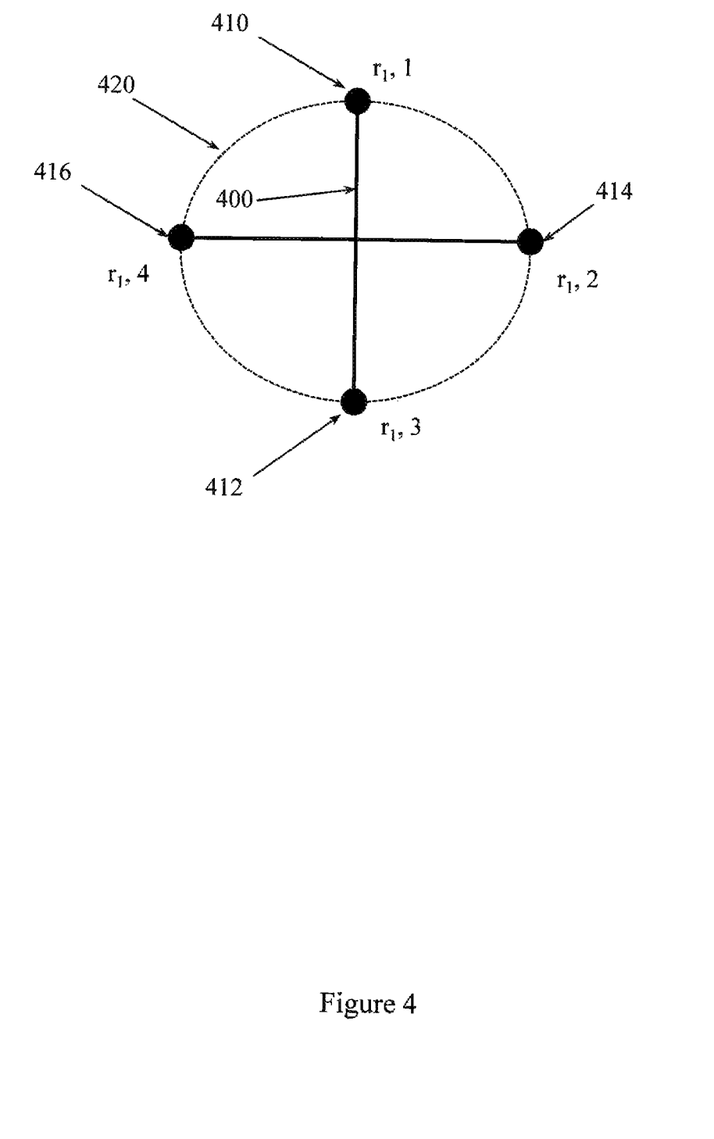
FIG. 4 illustrates a multi-echo projection acquired in a single TR.

FIG. 4 illustrates a multi-echo projection 400 that touches the surface 420 of an object at multiple points (e.g., 410, 412, 414, 416). Multi-echo projection 400 is employed when multiple projections are acquired in a single shot.

In one embodiment, the end point of a projection may be treated like a point charge on the surface of a volume. A volume to be imaged (e.g., sphere, ovoid) may have known physical properties. For example, characteristics of point charges on the surface of a sphere are well understood. Therefore, conceptually treating the end point of a projection like a point charge facilitates building upon charge repulsion approaches that determine the optimal packing of charges on the surface of a volume. Conventional charge packing approaches may begin with a random distribution of charges and iterate via, for example, a descent approach, to reach a minimal potential energy. In one embodiment, example apparatus and methods may require and/or desire that certain projections be made, and thus the starting points may not be chosen randomly.

In conventional actual charge packing analysis, each point charge is allowed to move independently. Example apparatus and methods may not allow end points to move independently. Instead, the relative locations of the end points are fixed within a single shot to preserve shape. In one embodiment, a shot can be treated like a rigid body with an axis of rotation at the origin. In this embodiment, a value can be computed for an end point. When the end point is treated like a point charge, the value may resemble a force value calculated as the sum of Coulomb forces from the other end points that are also being treated like point charges in other shots. Continuing with the point charge analogy, point sources in a single shot are assumed not to exert a force on other point sources in that single shot.

A review of conventional electrical repulsion theory, notation, and mathematics is provided. The force of a point charge $q_z$ at location $\hat{r}2$ on point charge $q_1$ at location $\hat{r}1$ is given by the vector form of Coulomb's law:

$$\vec{F_{21}} = \frac{1}{4\pi\varepsilon_0} \frac{q_1 q_2}{r^2} \hat{r}_{21} \qquad [1]$$

where r is the distance between two charges, $\epsilon_0$ is the electrical permittivity of free space and $\vec{F_{21}}$ is a unit vector pointing in the direction from charge2 to charge1. Actual point charge distribution approaches consider the units because actual physical forces exist and are analyzed. Example apparatus and methods are not actually analyzing or manipulating actual physical forces and thus the physical units are not considered further. Thus, [1] can be simplified to:

$$\vec{F_{21}} = \frac{(\vec{r_2} - \vec{r_1})}{|\vec{r_2} - \vec{r_1}|^3} \qquad [2]$$

Conventional point charge descent algorithms may compute a tangential component of the force computed in [2] and then determine a net tangential force on one charge due to all the other charges. The position of a point charge can then be updated as a function of the net tangential force. However, as noted above, conventional approaches consider the force from all charges on all other charges since all point charges are able to move independently. Example apparatus and methods do not take this approach because end points are fixed in a shot. Since end points are fixed in a shot, "forces" associated with other end points in the same shot are not considered when analyzing an end point in a shot. Instead, "forces" associated with end points in different shots are considered. While conventional approaches to charge distribution deal with actual forces, example apparatus and methods may take an approach where a value that represents a "force" associated with an end point in another shot influences a value associated with an end point in this shot. In one example the influence may be based, at least in part, on a model of point charge forces. In another example, the influence may be based, at least in part, on other factors or models.

Figure 5:
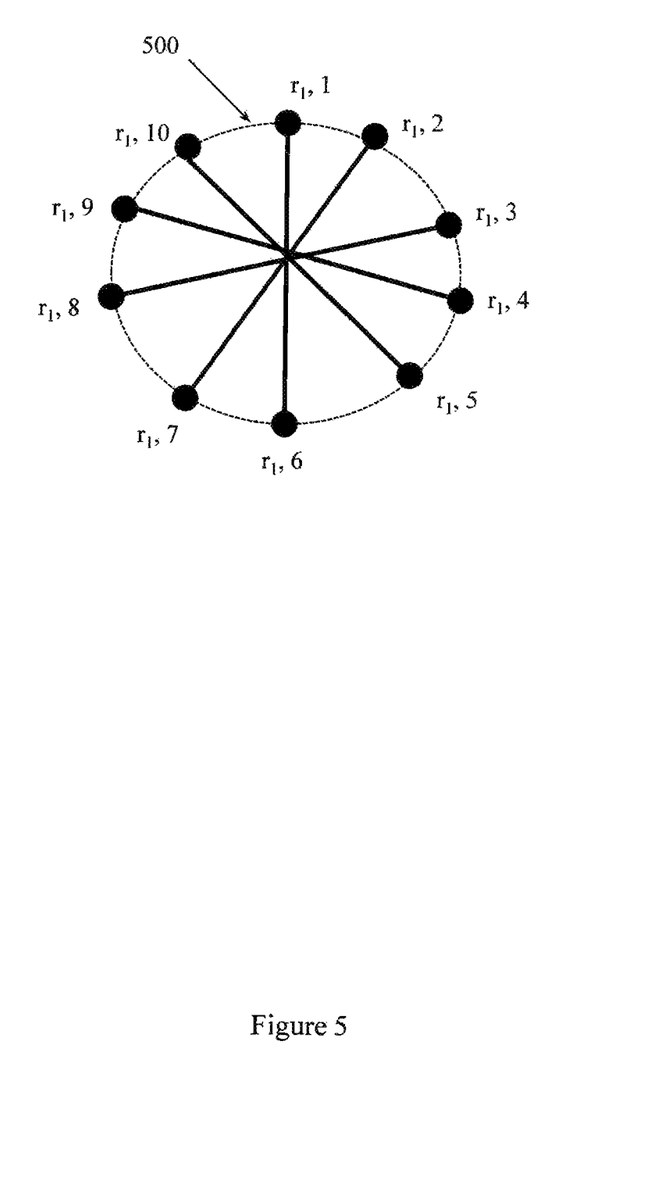
FIG. 5 illustrates a multi-echo projection acquired in a single TR.

Example apparatus and methods that support multi-shot 3D radial MRI consider a general case where multiple projections with a fixed position relative to each other are played out in a single shot. K-space may then be filled using multiple shots. In this example, let $N_s$ be the number of shots and let $N_p$ be the number of projections in a single shot. An example trajectory for $N_P$=5 is illustrated in FIG. 5. The trajectory is represented by ten end points (R1, 1) through (R1, 10) on the surface of a sphere 500. While a sphere 500 is illustrated, more generally the end points of a projection may be considered to lie on the surface of a known volume. Since example apparatus and methods fix the trajectory in a shot, the end points are considered not to exert a "force" on each other and thus will not move relative to each other. Instead of considering "forces" (e.g., influences) on end points within a shot, example apparatus and methods restrict their analysis to considering "forces" (e.g., influences) exerted from other shots.

Continuing the point charge analogy, the "forces" may computed using:

$$\vec{F}_{ik} \propto \sum_{s=1, s \neq i}^{N_S} \sum_{p=1}^{N_P} \frac{\vec{r}_{i,k} - \vec{r}_{s,p}}{|\vec{r}_{i,k} - \vec{r}_{s,p}|^3} \quad [3]$$

Where $N_S$ is the number of shots, $N_P$ is the number of projections in a shot, and $\vec{r}_{i,k}$ is the spatial position of charge k in shot i.

In one embodiment, the end points can be treated as points for which a value can be computed based on the values associated with end points in other shots. The value for an end point will not be computed from values associated with end points in its own shot. In this embodiment, the end points in a shot retain their relationship to each other and thus could be seen to rotate about the origin of a logical rigid body defined by the fixed end points. Modeling the set of end points as describing a rigid body that is free to rotate around its origin facilitates modeling the values associated with the end points as point charges and facilitates modeling the influence of other end points in other shots as producing a net torque that rotates the rigid body defined by the set of end points.

In one example, the net force $\vec{F}_{i,k}$ applied to a point $\vec{r}_{i,k}$ can be described by:

$$\vec{\tau}_{i,k} = \vec{r}_{i,k} \times \vec{F}_{i,k} \quad [4]$$

While [4] describes the net force applied to a single point, the net force applied to the set of end points associated with the projections that make up the entire shot would be the sum of the forces applied to the entire set of end points associated with the projections that make up the shot. To continue the point charge and torque analogy, the net torque applied to the rigid body described by the set of fixed end points would be the sum of the torques applied to the members of the set of fixed end points.

Achieving a desired spacing and thus distribution involves determining a direction and an amount by which the shot modeled by rigid body defined by the set of fixed end points should be rotated. In one embodiment, the axis of rotation may be defined by:

$$\vec{\mu}_i = \frac{\vec{\tau}_i}{|\vec{\tau}_i|} \quad [5]$$

and the magnitude of the rotation (e.g., the rotation angle) may be defined by:

$$\phi_i = \alpha |\vec{\tau}_i| \quad [6]$$

where $\alpha$ is a configurable step size.

A rotation matrix $R_i$ defined by the rotation $\phi_i$ about axis $\vec{\mu}_i = |\mu_x, \mu_y, \mu_z|$ can then be computed as:

$$R_i = \begin{bmatrix} \mu_x^2 + (1 - \mu_x^2)c & \mu_x\mu_y(1-c) - \mu_z s & \mu_x\mu_z(1-c) + \mu_y s \\ \mu_x\mu_y(1-c) + \mu_z s & \mu_y^2 + (1-\mu_y^2)c & \mu_y\mu_z(1-c) - \mu_x s \\ \mu_x\mu_z(1-c) - \mu_y s & \mu_y\mu_z(1-c) + \mu_x s & \mu_z^2 + (1-\mu_z^2)c \end{bmatrix}$$

where $c = \cos(\phi_i)$ and $s = \sin(\phi_i)$.

With the magnitude of the rotation, the axis of rotation, and the rotation matrix available, new positions for end points in the projection can be calculated according to:

$$\vec{r}'_{i,k} = R_i \vec{r}_{i,k} \quad [7]$$

A configurable scaling factor $\alpha$ can be applied so that new end point positions reduce $\vec{F}_{i,k}$ in subsequent iterations.

So far, the example apparatus and method will function to distribute the full set of projections over the desired volume. However, it also may be desirable to have certain subsets of the full number of shots distributed. This additional distribution may address, for example, interactions between shots that are made close together in time. Thus, in one embodiment, not only is a distribution in k-space made, but a distribution in "kt-space" is made, where kt-space refers to k-space through time.

In one embodiment, the force $\vec{F}_{i,k}$ can be computed taking into account a temporal weighting term that allows distribution in kt-space, as opposed to just in k-space. Thus, $\vec{F}_{i,k}$ may be computed according to:

$$\vec{F}_{ik} \propto \sum_{s=1, s \neq i}^{N_S} \sum_{p=1}^{N_P} \frac{\vec{r}_{i,k} - \vec{r}_{s,p}}{\Delta t_{i,s}^\beta |\vec{r}_{i,k} - \vec{r}_{s,p}|^3}, \text{ for } \beta \geq 0 \quad [8]$$

where $\Delta t_{i,s}$ is the magnitude of the temporal distance between shot i and shot s. The temporal distance between shot i and shot s may be, for example, the amount of time that elapses between shot i and shot s.

In some examples, the same $N_S$ shots may be repeated periodically and thus shots that occur near the end of one set of shots may need to be considered as potentially impacting shots that occur near the beginning of another set of shots. Therefore, in one embodiment, $\Delta t_{i,s}$ may be calculated according to:

$$\Delta t_{i,s} = \min(|i-s|, N_s - |i-s|) \quad [9]$$

where the min function accounts for the case where the same $N_s$ shots are repeated periodically.

Consider the impact of $\Delta t_{i,s}$ being in the denominator of [8]. Since $\Delta t_{i,s}$ is in the denominator, shots that are closer together in time will have a larger influence on each other. Increasing $\beta$ would result in the net force also being weighted towards shots closer together in time. Setting $\beta$ to zero would eliminate any temporal penalty for shots that are closer together in time. But recall that a distribution in both space and in time— also referred to as a distribution in kt-space—may be desired. Therefore, in one embodiment, $\beta$ may be configurable and dynamically adaptable as example apparatus and methods iterate towards a convergence. In one example, $\beta$ may be started at a first value (e.g., 3, 4) and then reduced towards 0 as the iterative process moves forward. Dynamically adapting β facilitates achieving desirable distributions of projections at different time scales.

While one example has demonstrated treating projections and end points within a shot equally by, for example, applying equal influences to the projections and end points, example apparatus and methods are not so limited. In one embodiment, different projections in a shot could be treated differently. This may facilitate, for example, promoting a desired distribution of subsets of the full readout length. This may be employed in, for example, field map estimation for individual echoes in a multi-echo radial trajectory.

While one example dealing with a sphere has been presented, once again example apparatus and methods are not so limited. In one embodiment, other field of view shapes including, but not limited to, cubes, prisms, rhombohedrons, icosahedrons, pyramids, cylinders, and ovoids may be employed.

While one example dealing with determining orders for radial projections has been described, the multi-shot end point influence on single shot fixed end points approach is not so limited. In one embodiment, the approach can be used to choose phase encoding locations for 3D Cartesian pulse sequences. In this embodiment, the approach would treat the end points as being distributed in a 2D planar region rather than on the surface of a 3D volume. In this approach, 3D position vectors would be reduced to 2D position vectors with position updates being similarly reduced. In one example, the points may be distributed over a region (e.g., square, rectangle). By way of illustration, the region may be considered to be a unit square and the 2D planar region is considered to be tiled with identical copies of the unit square. In this example, the distances would be modified to be the smaller of the distance to a given point or the distance to its nearest periodic replica. Once again, the influence of end points from other shots in time are used to determine a new position for a fixed end point in a single shot. The influence of other end points in the single shot are not considered for determining the new position for a fixed end point in the single shot.

Sampling kt-space is used to determine what a 3D object looks like over time. Applications where sampling kt-space is employed include, but are not limited to, cardiac imaging, contrast enhanced tumor imaging, arterial imaging, and functional MRI. These applications may seek to understand how a 3D object changes over time due, for example, to the heart beating, to blood flowing, to the uptake of a contrast agent, to the uptake of oxygen or carbon dioxide, to the reduction in a tumor during a procedure (e.g., radiation treatment, laser ablation), and other events. Conventionally, if the same set of projections is used at the same points in a time cycle, then MR signals may only be received from certain areas of a volume to be studied. Additionally, if a set of projections requires a period of time X to acquire, then the smallest piece of time that can be imaged depends directly on X. Something that happens in less than X amount of time may not be able to be imaged.

Example apparatus and methods compute more equidistant distributions of projections. Distributions may be determined for projections including, but not limited to, radial projections, bent projections, multi-echo projections, and Cartesian projections.

The following includes definitions of selected terms employed herein. The definitions include various examples and/or forms of components that fall within the scope of a term and that may be used for implementation. The examples are not intended to be limiting. Both singular and plural forms of terms may be within the definitions.

References to "one embodiment", "an embodiment", "one example", "an example", and so on, indicate that the embodiment(s) or example(s) so described may include a particular feature, structure, characteristic, property, element, or limitation, but that not every embodiment or example necessarily includes that particular feature, structure, characteristic, property, element or limitation. Furthermore, repeated use of the phrase "in one embodiment" does not necessarily refer to the same embodiment, though it may.

"Computer-readable medium", as used herein, refers to a medium that stores signals, instructions and/or data. A computer-readable medium may take forms, including, but not limited to, non-volatile media, and volatile media. Non-volatile media may include, for example, optical disks, magnetic disks, and other disks. Volatile media may include, for example, semiconductor memories, dynamic memory, and other disks. Common forms of a computer-readable medium may include, but are not limited to, a floppy disk, a flexible disk, a hard disk, a magnetic tape, other magnetic medium, an ASIC, a CD, other optical medium, a RAM, a ROM, a memory chip or card, a memory stick, and other media from which a computer, a processor or other electronic device can read.

"Logic", as used herein, includes but is not limited to hardware, firmware, software in execution on a machine, and/or combinations of each to perform a function(s) or an action(s), and/or to cause a function or action from another logic, method, and/or system. Logic may include a software controlled microprocessor, a discrete logic (e.g., ASIC), an analog circuit, a digital circuit, a programmed logic device, a memory device containing instructions, and other embodiments. Logic may include one or more gates, combinations of gates, or other circuit components. Where multiple logical logics are described, it may be possible to incorporate the multiple logical logics into one physical logic. Similarly, where a single logical logic is described, it may be possible to distribute that single logical logic between multiple physical logics.

"Signal", as used herein, includes but is not limited to, electrical signals, optical signals, analog signals, digital signals, data, computer instructions, processor instructions, messages, a bit, a bit stream, or other means that can be received, transmitted and/or detected.

Some portions of the detailed descriptions that follow are presented in terms of algorithms and symbolic representations of operations on data bits within a memory. These algorithmic descriptions and representations are used by those skilled in the art to convey the substance of their work to others. An algorithm, here and generally, is conceived to be a sequence of operations that produce a result. The operations may include physical manipulations of physical quantities. Usually, though not necessarily, the physical quantities take the form of electrical or magnetic signals capable of being stored, transferred, combined, compared, and otherwise manipulated in a logic. The physical manipulations create a concrete, tangible, useful, real-world result.

It has proven convenient at times, principally for reasons of common usage, to refer to these signals as bits, values, elements, symbols, characters, terms, numbers, and other terms. It should be borne in mind, however, that these and similar terms are to be associated with the appropriate physical quantities and are merely convenient labels applied to these quantities. Unless specifically stated otherwise, it is appreciated that throughout the description, terms including processing, computing, determining, and other terms refer to actions and processes of a computer system, logic, processor, or similar electronic device that manipulates and transforms data represented as physical (electronic) quantities.

Example methods may be better appreciated with reference to flow diagrams. While for purposes of simplicity of explanation, the illustrated methodologies are shown and described as a series of blocks, it is to be appreciated that the methodologies are not limited by the order of the blocks, as some blocks can occur in different orders and/or concurrently with other blocks from that shown and described. Moreover, less than all the illustrated blocks may be required to implement an example methodology. Blocks may be combined or separated into multiple components. Furthermore, additional and/or alternative methodologies can employ additional, not illustrated blocks.

Figure 6:
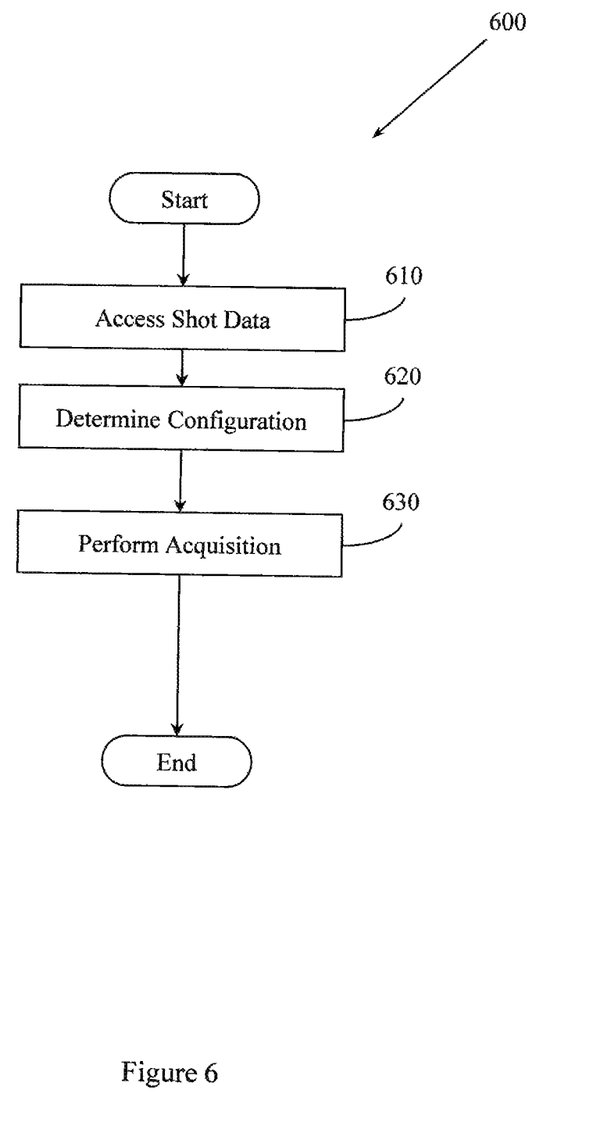
FIG. 6 illustrates a method associated with ordering projections for magnetic resonance (MR).

FIG. 6 illustrates a method 600. Method 600 controls an MR apparatus to configure projections to achieve improved distribution uniformity compared to conventional systems. Method 600 includes, at 610, accessing shot data that describes a plurality of shots to be employed through time in a 3D acquisition by the MR apparatus. A projection, a shot, and the plurality of shots are configured to sample a 3D volume. A projection may be defined, for example, by one or more end points associated with the 3D volume. The end points may be, for example, positions where a projection intersects the surface of a 3D volume. Method 600 may order different types of projections including, but not limited to, radial projections, bent projections, and multi-echo projections. In one example, the acquisition may be a dynamic 3D acquisition. In one example, multiple projections may be applied per TR.

Method 600 also includes, at 620, determining a configuration for the plurality of shots. In one embodiment, the configuration is crafted to produce a desired target uniformity in k-space. In one example the desired k-space distribution uniformity threshold is at least ninety percent. In another example, the desired k-space distribution uniformity threshold is at least ninety-nine percent. In yet another example, the desired k-space distribution uniformity is a distribution where all end points are equidistant from all other end points. Other thresholds may be employed. In one embodiment, the configuration for the plurality of shots may include a portion for which uniformity is desired and portion for which a non-uniform distribution is desired. For example, in one portion it may be desirable to bunch shots together while in another portion it may be desirable to not have shots bunched together. Thus, in one example, the target uniformity threshold may describe a uniform portion of the configuration of the plurality of shots and a non-uniform portion of the configuration of the plurality of shots. In one embodiment, the non-uniform portion may describe, for example, a pre-defined non-uniform distribution.

Figure 11:
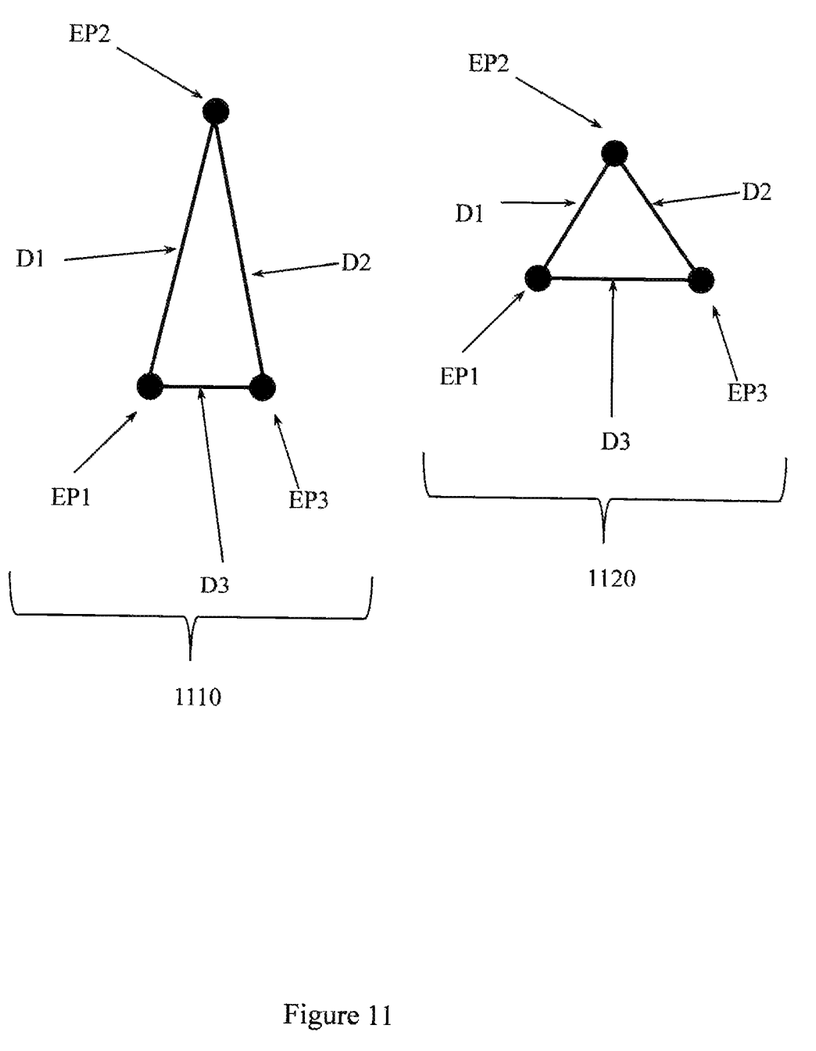
FIG. 11 illustrates sets of end points.

The uniformity threshold describes relationships between distances between end points. FIG. 11 illustrates sets of three end points (EP1, EP2, EP3). There is a first distance D1 between a EP1 and EP2, there is a second distance D2 between EP2 and EP3, and there is a third distance D3 between EP1 and EP3. Example apparatus and methods are configured to place shots so that the distances between the end points satisfy a uniformity threshold. The uniformity threshold describes the magnitude of the differences between the distances. For example, if D1 is close to D2 but both D1 and D2 are >>D3, as illustrated in 1110, then a uniformity threshold would not likely be met. However, if D1 is close to both D2 and D3, as illustrated in 1120, then a uniformity threshold may be met. While three points are illustrated, a greater number of end points and thus a greater number of distances may be considered.

Method 600 also includes, at 630, controlling the MR apparatus to perform the 3D acquisition according to the configuration. In one example, performing the acquisition according to the configuration will produce distribution uniformity for projections not just in space but also in time. Thus performing the acquisition at 630 may produce a uniformity in kt-space that exceeds a kt-space distribution uniformity threshold. In one example, the kt-space uniformity threshold is at least ninety percent while in another example the kt-space uniformity threshold is at least ninety-nine percent. Other thresholds may be employed.

In one example, method 600 orders projections to enhance global k-space distribution uniformity. In another example, method 600 orders projections to enhance local distribution uniformity. In yet another example, method 600 orders shots to enhance both a global k-space or kt-space distribution uniformity and a local k-space or kt-space distribution uniformity. In one example, decisions that affect both global uniformity and local uniformity may be weighted towards either global or local distribution uniformity.

While FIG. 6 illustrates various actions occurring in serial, it is to be appreciated that various actions illustrated in FIG. 6 could occur substantially in parallel. By way of illustration, a first process could access shot data, a second process could determine the configuration, and a third process could perform the acquisition. While three processes are described, it is to be appreciated that a greater and/or lesser number of processes could be employed and that lightweight processes, regular processes, threads, and other approaches could be employed.

Figure 7:
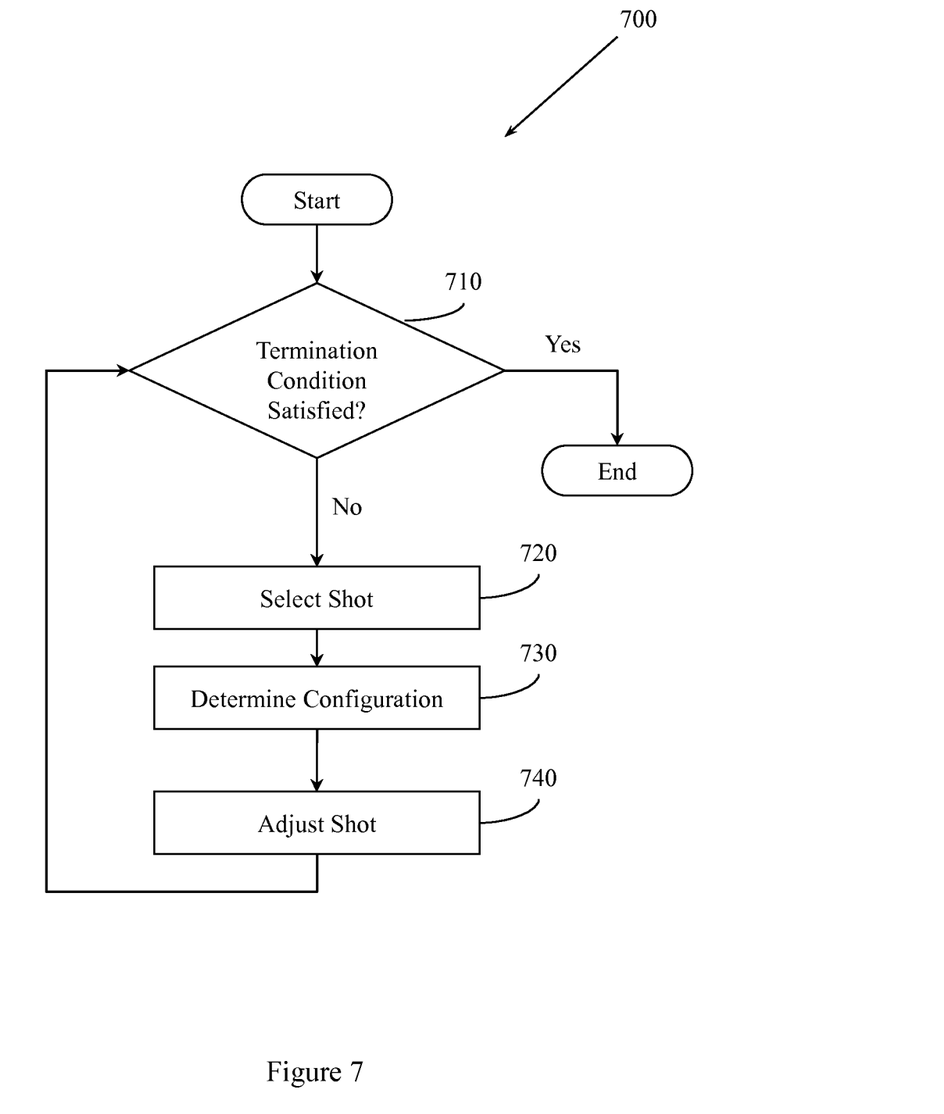
FIG. 7 illustrates a method associated with ordering projections for MR.

FIG. 7 illustrates a method 700. Method 700 illustrates an iterative approach to determining the configuration. In one example, the iterative approach may be performed as controlled by a descent method where the approach continues until a termination condition is met. Thus, method 700 includes, at 710, making a determination whether the termination condition is met. The termination condition may be, for example, that the uniformity of the distribution in k-space satisfies the k-space distribution uniformity threshold or that the uniformity of the distribution in kt-space satisfies a kt-space distribution uniformity threshold. The termination condition may also be, for example, a determination that adjusting the shot will not improve the distribution uniformity. The termination condition may also be, for example, a determination that a pre-determined number of iterations have been performed. Other termination conditions may be employed.

If the termination condition is satisfied at 710, then method 700 may conclude. But if the termination condition is not satisfied at 710, the processing may continue to iterate through actions 720, 730, and 740.

Method 700 includes, at 720, selecting a shot to be adjusted from the plurality of shots. Shots may be selected in orders including, but not limited to, randomly, according to a pre-set pattern, based on a bunching factor, in the order in which they are presented, in the order in which they are already arranged, and using other approaches. Once a shot has been selected, its end points may be fixed to create a logical rigid body whose points and thus projections can be adjusted collectively while retaining their relationships within a shot.

Method 700 also includes, at 730, determining an adjustment for the shot. The adjustment is crafted to attempt to improve the distribution uniformity in k-space or kt-space. In a descent controlled approach, when no further improvements are possible, or when an improvement would be less than an improvement delta threshold, then the adjustment may not be applied and method 700 may terminate. The adjustment may be based, at least in part, on a relationship between end points in the shot to be adjusted and end points in shots other than the shot to be adjusted.

Method 700 also includes, at 740, adjusting the shot. The shot can be adjusted to improve global distribution uniformity and/or local distribution uniformity. Adjusting the shot may include rotating the logical rigid body described by the end points in the shot that were fixed before determining the adjustment.

In one example, the adjustment may be scaled in time so that the influence of end points in two different shots varies directly with temporal distance between the two shots. In another example, the adjustment may be scaled in space so that the influence of end points in two different shots varies directly with spatial distance between the two shots. In another example, the adjustment may be scaled in both time and space so that the influence of end points in two different shots varies directly with both the spatial and temporal distance between the shots.

Figure 8:
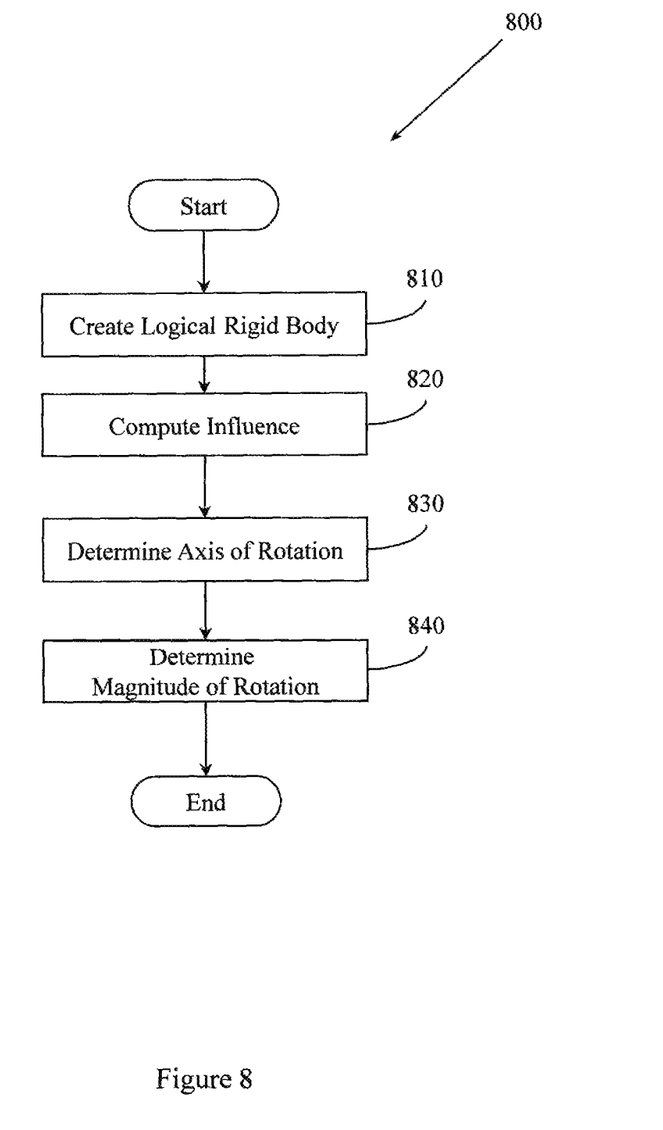
FIG. 8 illustrates a method associated with ordering projections for MR.

FIG. 8 illustrates a method 800. Method 800 illustrates one approach for determining the adjustment. Method 800 includes, at 810, creating a logical rigid body having an origin by logically fixing relative locations of end points in projections in the shot to be adjusted. As described above, in one example the end points in projections in the shot can be identified as the points where projections touch the logical surface of a defined 3D volume.

Once the end points have been identified and fixed, method 800 continues, at 820, by computing an influence that end points in other projections in other shots have on the fixed end points in this projection. In one example, the influence exerted by end points is determined by the relationship (e.g., Coulomb forces) used in the analysis. Example equations for determining the influence (e.g., Force, torque) are also provided above. While the Coulomb force approach is described, other relationships may produce other influences.

In one example, the relationship between points, and thus the influence exerted by points on other points, is modeled after a charge repulsion approach for determining optimal low energy packing of charges on the surface of a volume. To support this model, end points may be modeled as logical point charges on the surface of the 3D volume. In this example, the influence may be modeled after a logical net Coulomb force that would exist between logical point charges on the surface of the 3D volume.

Method 800 includes, at 830, determining an axis of rotation about the origin for the logical rigid body as a function of the influence and, at 840, determining a rotation magnitude for the logical rigid body as a function of the influence. Example equations for determining the axis of rotation and the magnitude of rotation are provided above. With the axis of rotation and the rotation magnitude computed, adjusting the shot at 740 (FIG. 7) may include rotating the logical rigid body about its origin along the axis of rotation by the rotation magnitude.

In one example, a method may be implemented as computer executable instructions. Thus, in one example, a computer-readable medium may store computer executable instructions that if executed by a machine (e.g., processor) cause the machine to perform method 600. While executable instructions associated with the method 600 are described as being stored on a computer-readable medium, it is to be appreciated that executable instructions associated with other example methods described herein may also be stored on a computer-readable medium. One example computer-readable medium may store instructions for controlling a computer to control an MRI apparatus to perform methods described herein.

Figure 9:
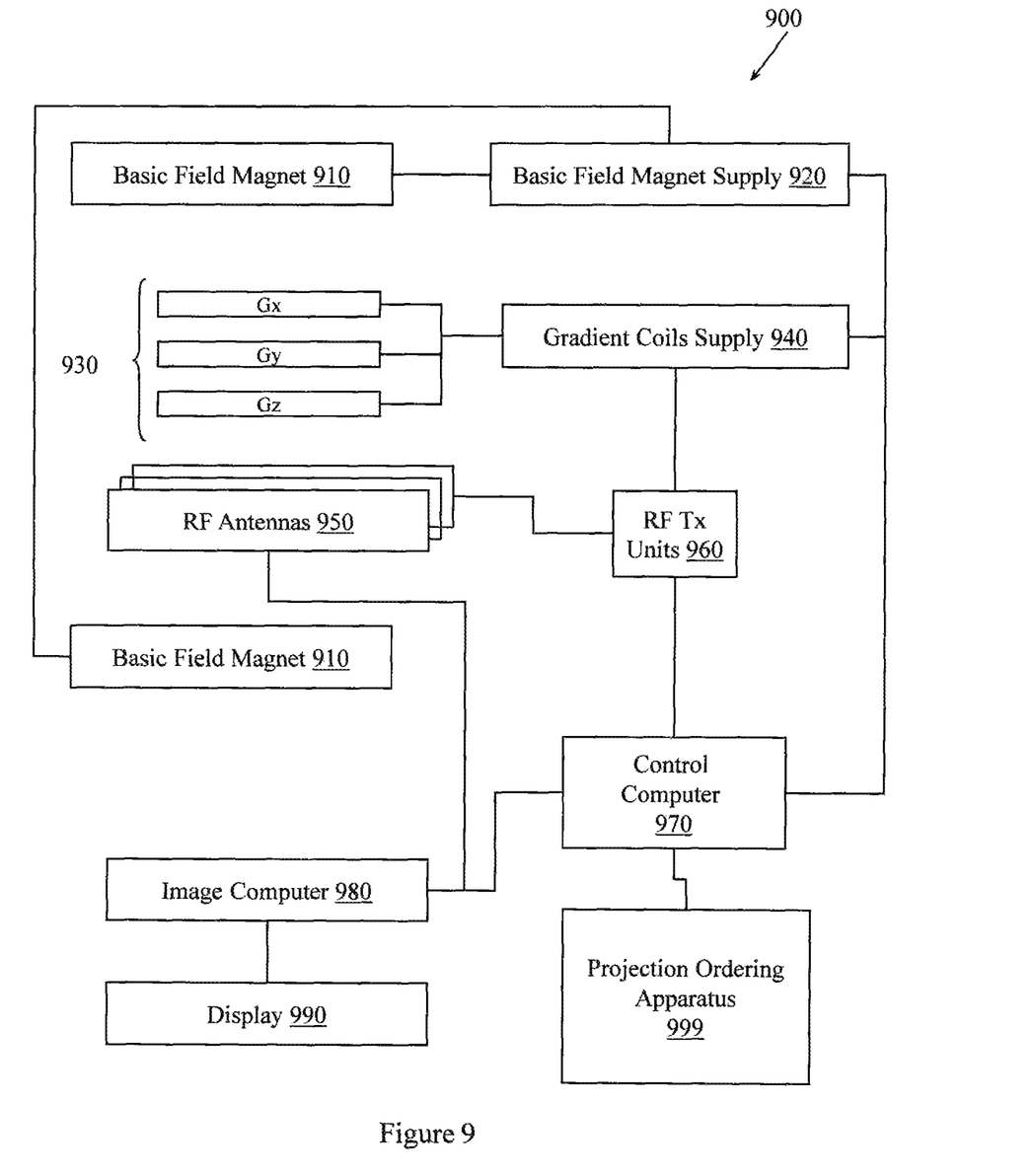
FIG. 9 illustrates an MRI apparatus associated with ordering projections for MR.

FIG. 9 illustrates an example MRI apparatus 900 configured with a projection ordering apparatus 999. The apparatus 999 may be configured with elements of example apparatus described herein and/or may perform example methods described herein. Thus, apparatus 999 may configure projections to have more equidistant spacing in different time scales than possible through conventional approaches. In one example, apparatus 999 provides means (e.g., hardware, software, firmware, circuits) for ordering projections in a 3D MRI acquisition to have equidistant spacing in kt-space. The ordering may be based, at least in part, on a charge repulsion analysis that treats points of projections that intersect the surface of a 3D volume to be imaged as point charges distributed on the surface of the 3D volume.

The apparatus 900 includes a basic field magnet(s) 910 and a basic field magnet supply 920. Ideally, the basic field magnets 910 would produce a uniform $B_0$ field. However, in practice, the $B_0$ field may not be uniform, and may vary over an object being imaged by the MRI apparatus 900. MRI apparatus 900 may include gradient coils 930 configured to emit gradient magnetic fields. The gradient coils 930 may be controlled, at least in part, by a gradient coils supply 940. In some examples, the timing, strength, and orientation of the gradient magnetic fields may be controlled and thus selectively adapted during an MRI procedure.

MRI apparatus 900 may include a set of RF antennae 950 that are configured to generate RF pulses and to receive resulting magnetic resonance signals from an object to which the RF pulses are directed. In some examples, how the pulses are generated and how the resulting MR signals are received may be controlled and thus may be selectively adapted during an MRI procedure. Separate RF transmission and reception coils can be employed. The RF antennas 950 may be controlled, at least in part, by a set of RF transmission units 960. An RF transmission unit 960 may provide a signal to an RF antenna 950.

The gradient coils supply 940 and the RF transmission units 960 may be controlled, at least in part, by a control computer 970. In one example, the control computer 970 may be programmed to control a parallel and/or dynamic MRI device. The magnetic resonance signals received from the RF antennas 950 can be employed to generate an image and thus may be subject to a transformation process. The transformation can be performed by an image computer 980 or other similar processing device. The image data may then be shown on a display 990. While FIG. 9 illustrates an example MRI apparatus 900 that includes various components connected in various ways, it is to be appreciated that other MRI apparatus and other MR apparatus may include other components connected in other ways.

Figure 10:
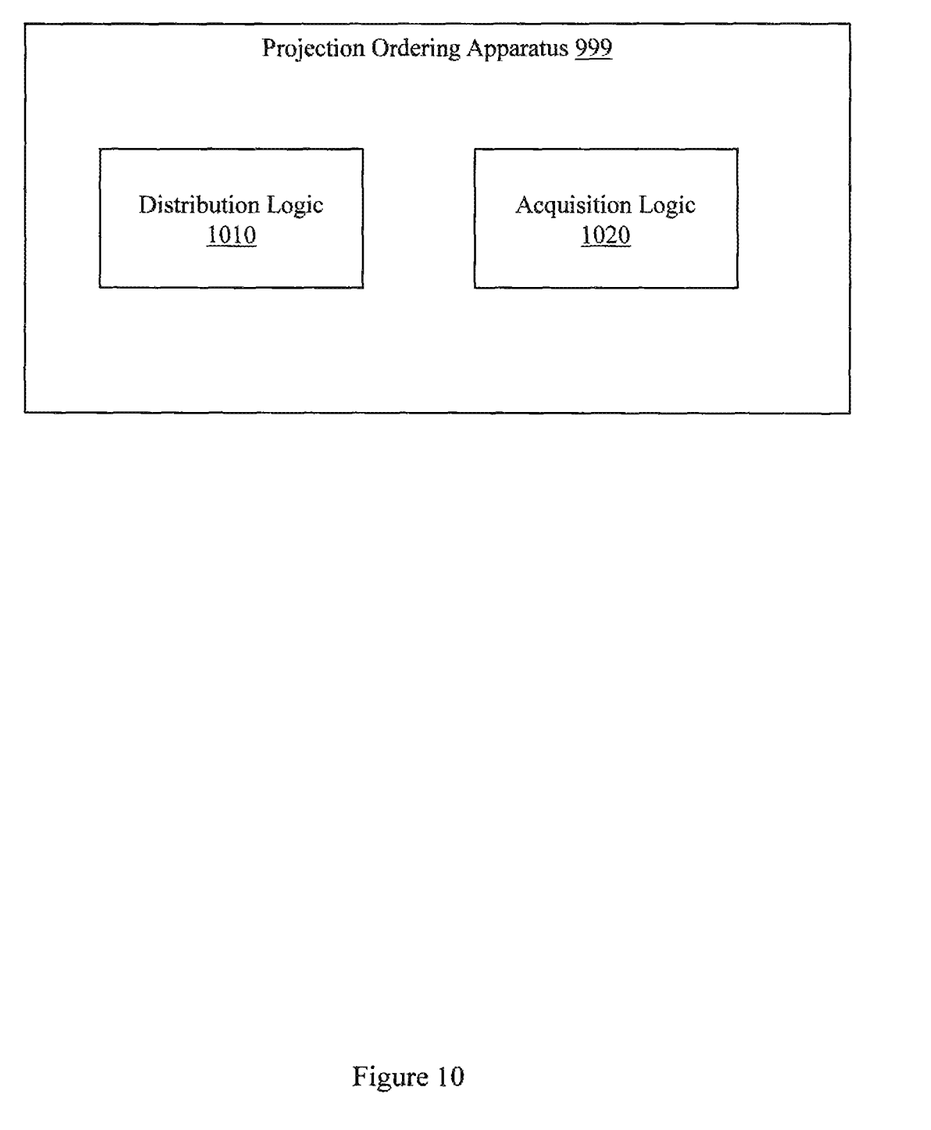
FIG. 10 illustrates an apparatus associated with ordering projections for MR.

FIG. 10 illustrates one embodiment of apparatus 999. The embodiment of apparatus 999 illustrated in FIG. 10 includes a distribution logic 1010 and an acquisition logic 1020. Distribution logic 1010 is configured to control an MR apparatus (e.g., MRI apparatus 900) to produce a target distribution in kt-space for a 3D MR acquisition associated with a 3D volume. The projections in the 3D acquisition are organized into shots. Distribution logic 1010 will determine and re-determine projections in a single shot with reference to projections in other shots.

In one example, the distribution logic 1010 produces the target distribution using an iterative descent approach. The iterative descent approach may start with an initial distribution that is manipulated into the target distribution. The manipulation may continue, for example, until a descent terminating condition is met. The descent terminating condition may be, for example, that a proposed manipulation would not improve the uniformity of the distributions. In one example, the iterative descent approach may perform point charge analyses like those described above in connection with analyzing point charges on the surface of a 3D volume.

In one example, the distribution logic 1010 is configured to perform the iterative descent approach by repeatedly performing a set of actions. The set of actions may include fixing the relative locations of end points in one shot to define a fixed shot. Defining the fixed shot may also be viewed as defining the skeleton of a rigid fixed body. The set of actions may also include determining a reconfiguration for the fixed shot based, at least in part, on interactions between the fixed shot and other shots associated with the target distribution. Once the reconfiguration has been determined, then distribution logic 1010 may reconfigure the fixed shot using the reconfiguration. After one shot has been reconfigured after being processed as the fixed shot, another shot may be reconfigured and then another shot may be reconfigured and so on until a termination condition is met.

In one example, the distribution logic 1010 is configured to determine the reconfiguration for the fixed shot by determining a reconfiguration axis of rotation and a reconfiguration rotation magnitude for the rigid body defined by the relative locations of end points that were fixed in the fixed shot. In this example, the distribution logic 1010 is configured to reconfigure the fixed shot by rotating the rigid body about its origin on the axis of rotation by the rotation magnitude amount.

Acquisition logic 1020 is configured to control the MRI apparatus to perform the 3D acquisition using the target distribution produced by distribution logic 1010. The projections in the 3D acquisition may include, but are not limited to, radial projections, bent projections, and multi-echo projections.

While example systems, methods, apparatus, and other embodiments have been illustrated by describing examples, and while the examples have been described in considerable detail, it is not the intention of the applicants to restrict or in any way limit the scope of the appended claims to such detail. It is, of course, not possible to describe every conceivable combination of components or methodologies for purposes of describing the systems, methods, apparatus, and other embodiments described herein. Therefore, the invention is not limited to the specific details, the representative apparatus, and illustrative examples shown and described. Thus, this application is intended to embrace alterations, modifications, and variations that fall within the scope of the appended claims.

To the extent that the term "includes" or "including" is employed in the detailed description or the claims, it is intended to be inclusive in a manner similar to the term "comprising" as that term is interpreted when employed as a transitional word in a claim.

To the extent that the term "or" is employed in the detailed description or claims (e.g., A or B) it is intended to mean "A or B or both". When the applicants intend to indicate "only A or B but not both" then the term "only A or B but not both" will be employed. Thus, use of the term "or" herein is the inclusive, and not the exclusive use. See, Bryan A. Garner, A Dictionary of Modern Legal Usage 624 (2d. Ed. 1995).

To the extent that the phrase "one or more of, A, B, and C" is employed herein, (e.g., a data store configured to store one or more of, A, B, and C) it is intended to convey the set of possibilities A, B, C, AB, AC, BC, and/or ABC (e.g., the data store may store only A, only B, only C, A&B, A&C, B&C, and/or A&B&C). It is not intended to require one of A, one of B, and one of C. When the applicants intend to indicate "at least one of A, at least one of B, and at least one of C", then the phrasing "at least one of A, at least one of B, and at least one of C" will be employed.

What is claimed is:

1. A non-transitory computer-readable storage medium storing computer executable instructions that when executed by a computer control the computer to perform a method for controlling a magnetic resonance (MR) apparatus, comprising:

accessing shot data that describes a plurality of shots to be employed through time in a three dimensional (3D) acquisition by the MR apparatus, where a shot comprises a plurality of radial projections, bent projections, or multi-echo projections, where a member of the plurality of shots is configured to sample a 3D volume, and where a member of the plurality of shots is defined, at least in part, by one or more end points that are locations where a projection intersects the surface of the 3D volume, and where the end points are modeled as point charges;

determining a configuration for the plurality of shots that will produce a distribution in k-space that satisfies a target k-space distribution uniformity threshold by:

repeating, until a termination condition is satisfied:

selecting a shot to be adjusted from the plurality of shots;

establishing an origin for a set of related end points for the shot by logically fixing the relative locations of the end points in the shot to be adjusted;

computing an influence on the end points in the shot to be adjusted, where the influence is produced by end points in shots other than the shot to be adjusted, where the influence is determined by a charge repulsion approach for determining optimal low energy packing of charges on the surface of the 3D volume, and where the influence is modeled after a net Coulomb force that would exist between point charges on the surface of the 3D volume;

determining, for the shot to be adjusted, as a function of the influence, an axis of rotation about the origin for the set of related end points that will improve the distribution uniformity in k-space, determining, for the shot to be adjusted, as a function of the influence, a rotation magnitude for the set of related end points that will improve the distribution uniformity in k-space; and adjusting the shot to be adjusted by rotating the set of related end points about its origin along the axis of rotation by the rotation magnitude; and controlling the MR apparatus to perform the 3D acquisition according to the configuration, where performing the 3D acquisition according to the configuration produces a distribution in kt-space that satisfies a kt-space distribution uniformity threshold of at least ninety percent.

2. The non-transitory computer-readable storage medium of claim 1, where the target k-space distribution uniformity threshold describes a uniform portion of the configuration of the plurality of shots and a non-uniform portion of the configuration of the plurality of shots.

3. The non-transitory computer-readable storage medium of claim 1, where the termination condition is, the distribution in k-space satisfying the k-space distribution uniformity threshold, the distribution in kt-space satisfying a kt-space uniformity threshold, a determination that adjusting the shot to be adjusted by the adjustment will not improve the match between the k-space distribution and the target k-space uniformity threshold, or a determination that a pre-determined number of iterations have been performed.

4. The non-transitory computer-readable storage medium of claim 3, where the termination condition is determined, at least in part, by a descent algorithm.

5. The non-transitory computer-readable storage medium of claim 1, where the acquisition is a dynamic 3D acquisition.

6. The non-transitory computer-readable storage medium of claim 1, comprising scaling the rotation magnitude in time so that the influence of end points between a first shot and a second shot varies directly with temporal proximity between the first shot and the second shot.

7. The non-transitory computer-readable storage medium of claim 1, comprising scaling the rotation magnitude in space so that the influence of end points between a first shot and a second shot varies directly with spatial proximity between the first shot and the second shot.

8. The non-transitory computer-readable storage medium of claim 1, comprising scaling the rotation magnitude in time and space so that the influence of end points between a first shot and a second shot varies directly with both temporal proximity between the first shot and the second shot and with spatial proximity between the first shot and the second shot.

9. The non-transitory computer-readable storage medium of claim 1, where the k-space distribution uniformity is a function of both global distribution between shots and local distribution between shots.

10. The non-transitory computer-readable storage medium of claim 1, comprising controlling the MRI apparatus to perform the acquisition by employing multiple projections per pulse sequence repetition time (TR).

\* \* \* \* \*